United States Patent [19]

Birrittella et al.

[11] Patent Number: 4,644,194
[45] Date of Patent: Feb. 17, 1987

[54] ECL TO TTL VOLTAGE LEVEL TRANSLATOR

[75] Inventors: Mark S. Birrittella; Robert R. Marley, both of Phoenix; Walter C. Seelbach, Fountain Hills, all of Ariz.

[73] Assignee: Motorola, Inc., Schaumburg, Ill.

[21] Appl. No.: 748,362

[22] Filed: Jun. 24, 1985

[51] Int. Cl.[4] ............... H03K 19/003; H03K 19/092; H03K 17/10; H03K 17/14
[52] U.S. Cl. .................... 307/475; 307/455; 307/443; 307/362; 307/264; 323/315
[58] Field of Search ............ 307/455, 456, 457, 475, 307/443, 355, 360, 363, 270, 264, 247 R; 323/312, 315–317

[56] References Cited

U.S. PATENT DOCUMENTS

| | | | |
|---|---|---|---|
| 3,766,406 | 10/1973 | Bryant et al. | 307/475 |
| 4,456,838 | 6/1984 | Taguchi et al. | 307/264 |
| 4,578,602 | 3/1986 | West et al. | 307/264 X |
| 4,609,837 | 9/1986 | Yagyuu et al. | 307/455 |

Primary Examiner—Stanley D. Miller
Assistant Examiner—David R. Bertelson
Attorney, Agent, or Firm—William E. Koch

[57] ABSTRACT

A voltage level translator circuit is provided that translates an input voltage referenced to an ECL supply voltage $V_{CC}$ to a voltage referenced to a TTL supply voltage $V_{EE}$ independent of power supply voltage variations. A first and a second embodiment have reference circuits coupled to receive a data input signal for providing a single signal referenced to a first supply voltage terminal to a current mirror. An output circuit is coupled to the current mirror for providing an output signal referenced to the second supply voltage terminal. A third embodiment has a reference circuit coupled to receive a data input signal for referencing a voltage on a first supply voltage terminal to a voltage on a second supply voltage terminal. A voltage setting circuit is coupled to the reference circuit for setting a voltage within the reference circuit. An output circuit is coupled to the voltage setting circuit for providing an output voltage referenced to a voltage on the second voltage terminal and independent of variations in supply voltages.

2 Claims, 4 Drawing Figures

ECL TO TTL VOLTAGE LEVEL TRANSLATOR

BACKGROUND OF THE INVENTION

1. Field of the Invention

This invention relates generally to an Emitter-Coupled-Logic (ECL) to Transistor-Transistor-Logic (TTL) voltage level translator and, more particularly, to a circuit that translates an input voltage referenced to an ECL supply voltage $V_{CC}$ to a voltage referenced to a TTL supply voltage $V_{EE}$ independent of power supply voltage variations.

2. Background Art

The TTL and ECL logic families are commonly found in circuits designed in recent years. It is generally understood that circuits of the ECL family are referenced to the "top" supply voltage $V_{CC}$ and circuits of the TTL family are referenced to the "bottom" supply voltage $V_{EE}$. Numerous requirements, such as mixed integrated logic, memory circuits, and system translator circuits, prompt the need to translate a signal referenced on supply voltage $V_{CC}$ to a signal referenced on supply voltage $V_{EE}$. It would be desirable to have this translation occur over the full range of $V_{EE}$ variations.

One previously known circuit, described more fully in the Detailed Description of the Invention and FIG. 1, comprises an input means connected to a first supply voltage terminal for receiving supply voltage $V_{CC}$, coupled for receiving an input signal referenced to supply voltage $V_{CC}$, and having a first and second differential output connected to a base of a first and second NPN transistor, respectively. The emitter of the first NPN transistor is coupled to a current mirror circuit by a first resistor. The emitter of the second NPN transistor is coupled to the current mirror circuit by a second resistor. The first and second resistors have equal resistance. The current mirror is connected to a second supply voltage terminal for receiving supply voltage $V_{EE}$. An emitter follower transistor has a base connected to a node between the second resistor and the current mirror and provides an output signal that is referenced to supply voltage $V_{EE}$. However, the current mirror portion of the circuit requires a differential input and is slow to perform the translation because of the resistive-capacitive time constant associated with the first and second resistors and the Miller capacitance of a transistor in the current mirror.

Thus, an improved ECL to TTL voltage level translator is needed having a single input to the current mirror and that provides a faster translation time.

SUMMARY OF THE INVENTION

Accordingly, it is an object of the present invention to provide an improved ECL to TTL voltage level translator.

Another object of the present invention is to provide an ECL to TTL voltage level translator having a single input to a current mirror therein.

A further object of the present invention is to provide an ECL to TTL voltage level translator having a faster response time.

Still another object of the present invention is to provide an ECL to TTL voltage level translator that is not subject to variations in $V_{EE}$.

In carrying out the above and other objects of the invention in one form there is provided a first and a second embodiment having an improved ECL to TTL voltage level translator having a reference circuit coupled between first and second supply voltage terminals and coupled to receive a data input signal, for providing a single signal referenced to the first supply voltage terminal. An output circuit is coupled between the first and second supply voltage terminals and is coupled to receive the single signal for providing an output signal referenced to the second supply voltage terminal. A third embodiment has a reference circuit coupled between a first supply voltage terminal and a second supply voltage terminal and coupled to receive a data input signal for referencing a voltage on the first supply voltage terminal to a voltage on the second supply voltage terminal. A voltage setting circuit is coupled between the first supply voltage terminal and the second supply voltage terminal and is coupled to the reference circuit for setting a voltage within the reference circuit. An output circuit is coupled between the first supply voltage terminal and the second supply voltage terminal and is coupled to the voltage setting circuit for providing an output voltage referenced to a voltage on the second voltage terminal and independent of variations in voltages on the first and second supply voltage terminals.

The above and other objects, features, and advantages of the present invention will be better understood from the following detailed description taken in conjunction with the accompanying drawing.

DETAILED DESCRIPTION OF THE INVENTION

Figure 1:
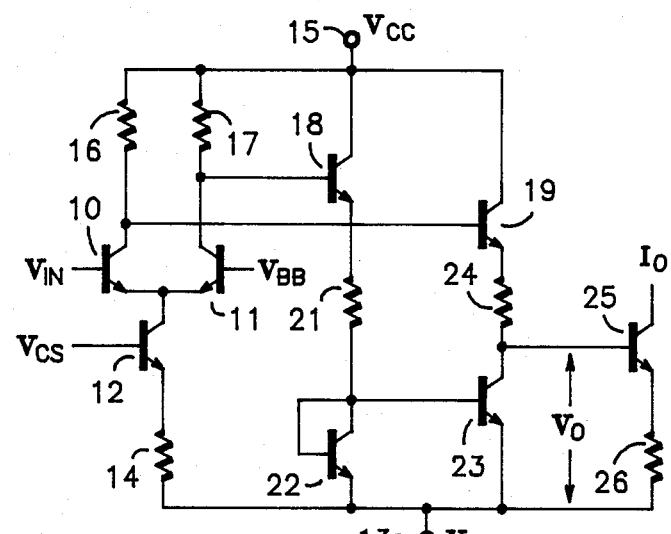
FIG. 1 is a schematic of a previously known circuit.

Referring to FIG. 1, a previously known circuit comprises NPN transistor 10 having a base coupled for receiving input signal $V_{IN}$ and NPN transistor 11 having a base coupled for receiving reference voltage $V_{BB}$. The emitters of transistors 10 and 11 are both connected to the collector of NPN transistor 12. Transistor 12 has a base for coupling to current source bias voltage $V_{CS}$, and an emitter coupled to supply voltage terminal 13 by resistor 14. The collectors of transistors 10 and 11 are coupled to supply voltage terminal 15 by resistors 16 and 17, respectively. Transistors 10, 11, 12 and resistors 14, 16, 17 comprise an ECL gate driver for providing a differential output to the bases of transistors 18 and 19.

Supply voltage terminal 15 is for coupling to supply voltage $V_{CC}$ and supply voltage terminal 13 is for coupling to supply voltage $V_{EE}$. Supply voltages $V_{CC}$ and $V_{EE}$ may generally be at any voltage level as long as supply voltage $V_{CC}$ is more positive with respect to supply voltage $V_{EE}$ by approximately four volts or more.

NPN transistor 18 has its base connected to the collector of transistor 11 and its collector connected to supply voltage terminal 15. Transistor 19 has its base connected to the collector of transistor 10 and its collector connected to supply voltage terminal 15. The emitter of transistor 18 is coupled by resistor 21 to the collector of transistor 22 and the bases of both transistors 22 and 23. The emitter of transistor 19 is coupled by resistor 24 to the collector of transistor 23 and the base of transistor 25. The emitter of transistor 23 is connected to supply voltage terminal 13 and the emitter of transistor 25 is coupled to supply voltage terminal 13 by resistor 26. The collector of transistor 25 is coupled for providing output signal $I_O$. Removal of transistor 25 and resistor 26 would allow $V_O$ to drive a TTL gate. Transistors 18, 22 and resistor 21 comprise a translator network for translating the voltage at the collector of transistor 11 to transistor 23. Transistors 19, 23 and resistor 24 comprise a translator network for translating the voltage at the collector of transistor 10 to transistor 22. Transistor 25 and resistor 26 comprise a load current generator for generating output signal $I_O$. The resistance of resistors 16 and 17 are made substantially equal to generate the same driver output voltages and the resistance of resistors 21 and 24 are made substantially equal. In operation, transistors 22 and 23 function as a current mirror providing equal current through resistors 21 and 24. When input signal $V_{IN}$ is high, the voltage at the collector of transistor 10 is $V_{BE}/2$. The voltage at the collector of transistor 11 is zero. The following equations will show that the voltage at the base of transistor 25 is $V_{EE}$ referenced and independent of variations in $V_{EE}$.

$$V_{EE} = V_{R16} + V_{BE19} + V_{R24} + V_O \quad\quad 1$$

where
$V_{R16}$ = voltage drop across resistor 16,
$V_{BE19}$ = base-emitter voltage of transistor 19,
$V_{R24}$ = voltage drop across resistor 24, and
$V_O$ = voltage between the base of transistor 25 and supply voltage terminal 13.

$$V_{EE} = V_{R17} + V_{BE18} + V_{R21} + V_{BE22} \quad\quad 2$$

where
$V_{R17}$ = voltage drop across resistor 17,
$V_{BE18}$ = base-emitter voltage of transistor 18,
$V_{R21}$ = voltage drop across resistor 21, and
$V_{BE22}$ = base-emitter voltage of transistor 22.

When $V_{IN}$ is low, $V_{R16}$ is zero and $V_{R17}$ can be $V_{BE}/2$. Solving equation 1 for $V_O$, $$V_O = V_{EE} - V_{R16} - V_{BE19} - V_{R24}, \quad\quad 3$$

and equation 2 for $V_{R21}$ $$V_{R21} = V_{EE} - 2.5\, V_{BE} \quad\quad 4$$

and since the current through transistor 22 equals the current through transistor 23, resistors 21 and 24 are equal, so $V_{R21}$ equals $V_{R24}$ and substituting $V_{R21}$ for $V_{R24}$ in equation 3, $V_O = 1.5\, V_{BE}$. When $V_{IN}$ is high, $V_{R17}$ is zero and $V_{R16}$ can be $V_{BE}/2$. Solving equations 1 and 2 as before, then $V_O = 0.5\, V_{BE}$. It may be seen in either case, that $V_O$ is independent of variations in $V_{EE}$.

Figure 2:
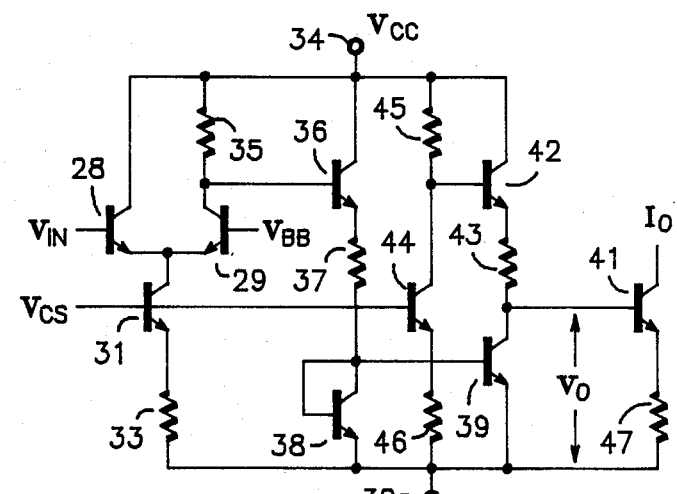
FIG. 2 is a schematic of a first embodiment of the invention.

Referring to FIG. 2, a first embodiment of the present invention comprises NPN transistor 28 having a base coupled for receiving input signal $V_{IN}$ and NPN transistor 29 having a base coupled for receiving reference voltage $V_{BB}$. The emitters of transistors 28 and 29 are both connected to the collector of NPN transistor 31. Transistor 31 has a base for coupling to current source bias voltage $V_{CS}$, and an emitter coupled to supply voltage terminal 32 by resistor 33. The collector of transistor 28 is connected to supply voltage terminal 34 and the collector of transistor 29 is coupled to supply voltage terminal 34 by resistor 35. Transistors 28, 29, 31 and resistors 33, 35 comprise a driver network for providing a single ended output to the base of transistor 36.

Supply voltage terminal 34 is for coupling to supply voltage $V_{CC}$ and supply voltage terminal 32 is for coupling to supply voltage $V_{EE}$. Supply voltages $V_{CC}$ and $V_{EE}$ may generally be at any voltage level as long as supply voltage $V_{CC}$ is more positive with respect to supply voltage $V_{EE}$.

NPN transistor 36 has its base connected to the collector of transistor 29 and its collector connected to supply voltage terminal 34. The emitter of transistor 36 is coupled by resistor 37 to the collector of transistor 38 and to the bases of both transistors 38 and 39. The emitters of transistors 38 and 39 are connected to supply voltage terminal 32. The collector of transistor 39 is connected to the base of transistor 41 and is coupled to the emitter of transistor 42 by resistor 43. Transistor 42 has its collector connected to supply voltage terminal 34 and its base connected to the collector of transistor 44 and coupled to supply voltage terminal 34 by resistor 45. Transistor 44 has its emitter coupled to supply voltage terminal 32 by resistor 46 and its base coupled for receiving current source bias voltage $V_{CS}$. Transistor 41 has its emitter coupled to supply voltage terminal 32 by resistor 47 and its collector coupled for providing output signal $I_O$. Transistor 44 and resistors 45, 46 comprise a referencing network needed to establish the current mirror biasing. Transistors 39, 42 and resistor 43 comprise a translator network for biasing the current mirror. Transistors 36, 38 and resistor 37 feed the $V_{CC}$ referenced signal into the current mirror causing $V_O$ to change. Transistor 41 and resistor 47 comprise a load current generator for providing output signal $I_O$.

The resistance of resistors 37 and 43 are made substantially equal. Voltage $V_O$ may be determined as follows.

$$V_{EE} = V_{R35} + V_{BE36} + V_{R37} + V_{BE38} \quad\quad 5$$

where
$V_{R35}$ = voltage drop across resistor 35,
$V_{BE36}$ = base-emitter voltage of transistor 36,
$V_{R37}$ = voltage drop across resistor 37, and
$V_{BE38}$ = base-emitter voltage of transistor 38.

$$V_{EE} = V_{R45} + V_{BE42} + V_{R43} + V_O \quad\quad 6$$

where
$V_{R45}$ = voltage drop across resistor 45 ($V_{BE}/2$),
$V_{BE42}$ = base-emitter voltage of transistor 42,
$V_{R43}$ = voltage drop across resistor 43, and
$V_O$ = voltage between the base of transistor 41 and supply voltage terminal 32.

Since $V_{R45}$ is $V_{BE}/2$, solving equation 6 for $V_O$:

$$V_O = V_{EE} - 1.5\, V_{BE} - V_{R43} \quad\quad 7$$

When input signal $V_{IN}$ is high, $V_{R35}$ is zero and equation 5 becomes $$V_{EE} = 2.0\, V_{BE} + V_{R37}. \quad\quad 8$$

Solving equations 7 and 8, and since $V_{R43}$ equals $V_{R37}$ because of the current mirror formed by transistors 38 and 39, $$V_O = 0.5 \, V_{BE}$$

When input signal $V_{IN}$ is low, $V_{R35}$ is $V_{BE}$ and equation 5 becomes $$V_{EE} = 3.0 \, V_{BE} + V_{R37} \qquad 9$$

and solving equations 7 and 9, and since $V_{R43}$ equals $V_{R37}$ due to the current mirror of transistors 38 and 39, then $V_O = 1.5 \, V_{BE}$.

It may be seen in either case, that $V_O$ is independent of variations in $V_{EE}$.

Figure 3:
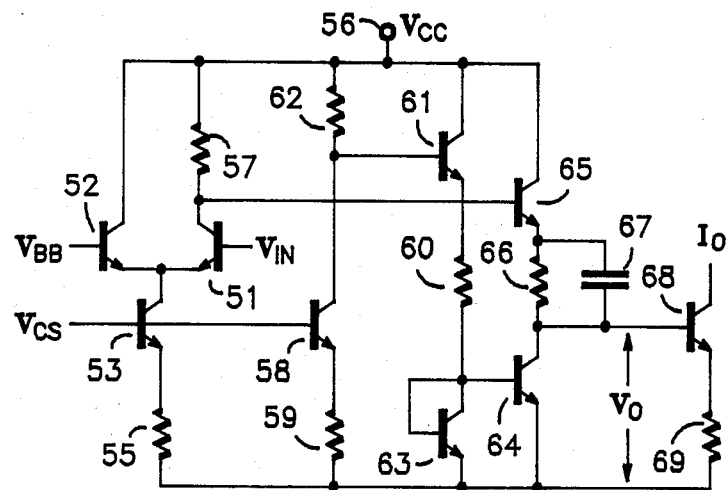
FIG. 3 is a schematic of a second embodiment of the invention.

Referring to FIG. 3, a second embodiment of the present invention comprises NPN transistor 51 having a base coupled for receiving input signal $V_{IN}$ and NPN transistor 52 having a base coupled for receiving reference voltage $V_{BB}$. The emitters of transistors 51 and 52 are both connected to the collector of NPN transistor 53. Transistor 53 has a base for coupling to current source bias voltage $V_{CS}$, and an emitter coupled to supply voltage terminal 54 by resistor 55. The collector of transistor 52 is connected to supply voltage terminal 56 and the collector of transistor 51 is coupled to supply voltage terminal 56 by resistor 57. Transistors 51, 52, 53 and resistors 55, 57 comprise a driver network for providing a single ended output to the base of transistor 65.

Supply voltage terminal 56 is for coupling to supply voltage $V_{CC}$ and supply voltage terminal 54 is for coupling to supply voltage $V_{EE}$. Supply voltages $V_{CC}$ and $V_{EE}$ may generally be at any voltage level as long as supply voltage $V_{CC}$ is more positive with respect to supply voltage $V_{EE}$.

NPN transistor 58 has a base for coupling to current source bias voltage $V_{CS}$, an emitter coupled to supply voltage terminal 54 by resistor 59, and a collector both connected to the base of transistor 61 and coupled to supply voltage terminal 56 by resistor 62. Transistor 61 has a collector connected to supply voltage terminal 56 and an emitter coupled by resistor 60 to the collector of transistor 63 and the bases of transistors 63 and 64. Transistor 64 has an emitter connected to supply voltage terminal 54 and a collector coupled to transistor 65 by resistor 66 and capacitor 67. Transistor 65 has a collector connected to supply voltage terminal 56 and a base connected to the collector of transistor 51. Transistor 68 has a base connected to the collector of transistor 64, an emitter coupled to supply voltage terminal 54 by resistor 69, and a collector coupled for providing output signal $I_O$. Transistors 61, 63 and resistors 60, 62 comprise a referencing network to bias current mirror transistors 63 and 64. Transistors 64, 65, resistor 66, and capacitor 67 comprise a translator network for translating the voltage at the collector of transistor 51 to the current mirror transistor 64. Transistor 68 and resistor 69 comprise a load current generator for generating output signal $I_O$.

The Miller effect capacitance across the base-collector of transistor 64 is amplified by the gain of the transistor and is therefore large, making it difficult to take the collector of transistor 64 high very quickly. Resistor 66 helps to take the collector of transistor 66 high but the value of the resistance must be limited in order to keep power dissipation minimized; therefore, capacitor 67 may be added to increase the speed of taking the collector of transistor 64 high.

The resistance of resistors 60 and 66 are made substantially equal. Voltage $V_O$ may be determined as follows.

$$V_{EE} = V_{R57} + V_{BE65} + V_{R66} + V_O \qquad 10$$

where
$V_{R57}$ = voltage drop across resistor 57,
$V_{BE65}$ = base-emitter voltage of transistor 65,
$V_{R66}$ = voltage drop across resistor 66, and
$V_O$ = voltage between the base of transistor 68 and supply voltage terminal 54.

$$V_{EE} = V_{R62} + V_{BE61} + V_{R60} + V_{BE63} \qquad 11$$

where
$V_{R62}$ = voltage drop across resistor 62,
$V_{BE61}$ = base-emitter voltage of transistor 61,
$V_{R60}$ = voltage drop across resistor 60, and
$V_{BE64}$ = base-emitter voltage of transistor 64.
Solving equation 10 for $V_O$, $$V_O = V_{EE} - V_{R57} - V_{BE} - V_{R66} \qquad 12$$

When input signal $V_{IN}$ is high, $V_{R57}$ is $V_{BE}$ and equation 12 becomes $$V_O = V_{EE} - 2.0 \, V_{BE} - V_{R66} \qquad 13$$

Solving equations 11 and 13 and since $V_{R60}$ and $V_{R66}$ are equal, and $V_{R62}$ equals $V_{BE}/2$, then $V_O = 0.5 \, V_{BE}$. When input signal $V_{IN}$ is low, $V_{R57}$ is zero and equation 12 becomes $$V_O = V_{EE} - V_{BE} - V_{R66} \qquad 14$$

Solving equations 11 and 14 and since $V_{R60}$ and $V_{R66}$ are equal, and $V_{R62}$ equals $V_{BE}/2$, then $V_O = 1.5 \, V_{BE}$. It may be seen in either case, that $V_O$ is independent of variations in $V_{EE}$.

Figure 4:
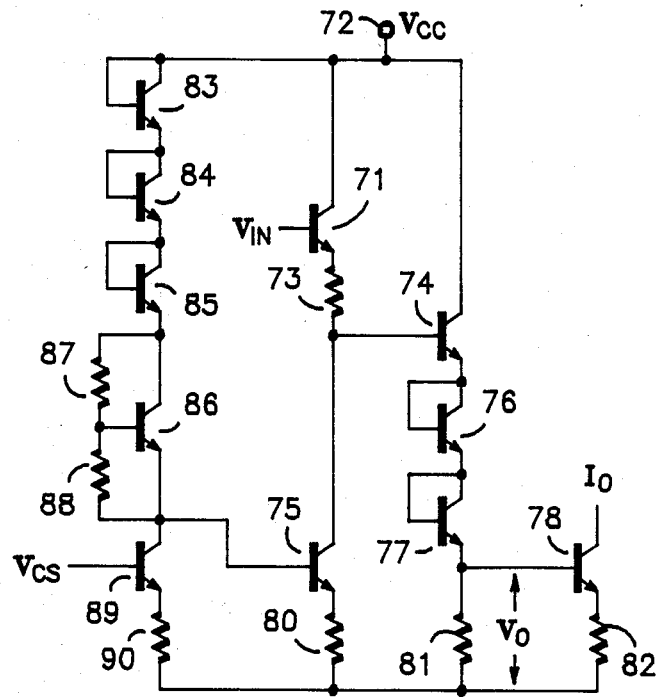
FIG. 4 is a schematic of a third embodiment of the invention.

Referring to FIG. 4, a third embodiment of the invention comprises NPN transistor 71 having a base coupled for receiving input signal $V_{IN}$, a collector connected to supply voltage terminal 72, and an emitter coupled by resistor 73 to the base of transistor 74 and the collector of transistor 75. Transistor 74 has a collector connected to supply voltage terminal 72 and an emitter connected to the base and collector of transistor 76. Transistor 76 has an emitter connected to the base and collector of transistor 77. Transistor 77 has an emitter connected to the base of transistor 78 and coupled to supply voltage terminal 79 by resistor 81. Transistor 78 has an emitter coupled to supply voltage terminal 79 by resistor 82 and a collector coupled for providing output signal $I_O$. Transistor 71 and resistors 73, 80 comprise a translator network for referencing $V_{IN}$ from supply voltage terminal 72 to supply voltage terminal 79. Transistors 74, 76, 77 and resistor 81 comprise a voltage shifting network comprising three diode drops to properly reference $V_O$. Transistor 78 and resistor 82 comprise a load current generator for generating the providing output signal $I_O$.

Transistor 75 has an emitter coupled to supply voltage terminal 79 by resistor 80. The voltage level at the base of transistor 75 is established by transistors 83, 84, 85, 86, and resistors 87 and 88. Transistors (diodes) 76, 77, 83, 84, 85, and 86 have been added to the circuit to reduce the possibility of transistor 75 from going into saturation at a large supply voltage. This also allows resistor 73 to have a small resistance (smaller voltage drop), thereby causing the voltage on the base of transistor 74 to transition more quickly. Additionally, resistor 80 greatly reduces the Miller effect of transistor 75.

Transistor 83 has a base and collector connected to supply voltage terminal 72, and an emitter connected to the base and collector of transistor 84. Transistor 84 has an emitter connected to the base and collector of transistor 85. Transistor 85 has an emitter connected to the collector of transistor 86 and coupled to the base of transistor 86 by resistor 87. The emitter of transistor 86 is coupled to its own base by resistor 88 and is connected to the collector of transistor 89. Transistor 89 has an emitter coupled to supply voltage terminal 79 by resistor 90 and a base coupled for receiving current source bias voltage $V_{CS}$. Transistors 75, 83, 84, 85, 86 and resistors 87, 88 comprise a voltage level network for setting the voltage across resistor 80.

The voltage level at the base of transistor 75 is $-4.5$ $V_{BE}$ (4.5 $V_{BE}$ below voltage $V_{CC}$ on terminal 72) due to the drop across transistors 83, 84, 85, 86, and resistors 87 and 88 (since the resistance of resistor 88 is twice the resistance of resistor 87) then $$V_{R80} = |V_{EE}| - 5.5\, V_{BE} \qquad 15$$

where $V_{R80}$ = voltage drop across resistor 80, and
$|V_{EE}|$ = absolute voltage on terminal 79.

Since the resistance of resistors 73 and 80 are made to be substantially equal and since the current through both resistors is substantially equal, the voltage drop across each resistor will be equal.

Input signal $V_{IN}$ would, for example, have two states comprising a minus base-emitter voltage $(-V_{BE})$ and zero volts. It can be shown that $$V_{R80} = |V_{EE}| - 5.5\, V_{BE} \qquad 16$$

and that $$|V_{EE}| = V_{IN} + V_{BE71} + V_{R73} + 3\, V_{BE} + V_O \qquad 17$$

where $V_{BE71}$ = base-emitter voltage of transistor 71, and
$V_{R73}$ = voltage across resistor 73.

But $V_{R73}$ equals $V_{R80}$, therefore, by substituting equation 16 into equation 17

$$|V_{EE}| = V_{IN} + V_{BE71} + V_{EE} - 5.5\, V_{BE} + 3\, V_{BE} + |V_O|,$$

Therefore, $$|V_O| = 1.5\, V_{BE} - V_{IN}. \qquad 19$$

For the case where input signal $V_{IN}$ is zero volts, $$|V_O| = 1.5\, V_{BE} \qquad 20$$

For the case where input signal $V_{IN}$ is at $-V_{BE}$ volts, $$|V_O| = 0.5\, V_{BE}. \qquad 21$$

Therefore, $$V_O = V_{BE} \pm (V_{BE}/2). \qquad 22$$

Thus, the state of input signal $V_{IN}$ determines the voltage level on the base of transistor 78. These voltages have a constant offset with respect to voltage $V_{EE}$.

In summary, the current flowing through transistor 78 is controlled by the state of input signal $V_{IN}$. The current flowing through transistor 78 is substantially independent of $V_{EE}$.

By now it should be appreciated that there has been provided a circuit that translates an input voltage referenced to an ECL supply voltage to a voltage referenced to a TTL supply voltage that is not subject to variations in $V_{EE}$.

We claim:

1. A voltage level translator circuit having a first supply voltage terminal and a second supply voltage terminal, comprising:

first means coupled between said first and second supply voltage terminals and coupled to receive a data input signal, for providing a signal referenced to said first supply voltage terminal;

second means coupled between said first and second supply voltage terminals for providing an output signal referenced to said second supply voltage terminal;

a first resistor;
   a second resistor;
   a third resistor;
   a fourth resistor;
   a diode;

a first transistor having a base coupled to said first supply voltage terminal by said first resistor, a collector coupled to said first supply voltage terminal, and an emitter coupled to said second means by said second resistor;

a second transistor having a collector coupled to said second means, an emitter coupled to said second supply voltage terminal, and a base coupled to said second supply voltage terminal by said diode;

a third transistor having a base coupled to said first means for receiving said signal, a collector coupled to aid first supply voltage terminal, and an emitter coupled to said base of said second transistor by said third resistor; and a fourth transistor having a base coupled for receiving a reference voltage, a collector coupled to said base of said first transistor, and an emitter coupled to said second supply voltage terminal by said fourth resistor.

2. A voltage level translator circuit having a first supply voltage terminal and a second supply voltage terminal, comprising:

first means coupled between said first and second supply voltage terminals and coupled to receive a data input signal, for providing a signal referenced to said first supply voltage terminal;

second means coupled between said first and second supply voltage terminals for providing an output signal referenced to said second supply voltage terminal;

a first resistor;
   a second resistor;
   a third resistor;
   a fourth resistor;
   a diode;

a first transistor having a base coupled to said first means for receiving said signal, a collector coupled to said first supply voltage terminal, and an emitter coupled to said second means by said first resistor;

a second transistor having a collector coupled to said second means, an emitter coupled to said second supply voltage terminal, and a base coupled to said second supply voltage terminal by said diode;

a third transistor having a base coupled to receive a reference voltage, a collector coupled to said first supply voltage terminal by said second resistor, and an emitter coupled to said second supply voltage terminal by said third resistor; and a fourth transistor having a base coupled to said collector of said third transistor, a collector coupled to said first supply voltage terminal, and an emitter coupled to said base of said second transistor by said fourth resistor.

* * * * *